(12) United States Patent
Ueda

(10) Patent No.: US 7,126,145 B2
(45) Date of Patent: Oct. 24, 2006

(54) FRAME TRANSFER PROBER

(75) Inventor: Yutaka Ueda, Mitaka (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 100 days.

(21) Appl. No.: 10/952,036

(22) Filed: Sep. 27, 2004

(65) Prior Publication Data

US 2005/0035776 A1 Feb. 17, 2005

(51) Int. Cl.
*G01N 21/00* (2006.01)
(52) U.S. Cl. ............ 250/559.29; 250/221; 250/559.12; 250/559.13; 250/559.37; 250/559.45
(58) Field of Classification Search .......... 250/559.12, 250/559.13, 559.29, 559.37, 221, 229.29, 250/559.45; 324/754–762, 765–769; 29/709, 29/712, 407.04, 407.05; 438/33, 68, 113, 438/460–465; 348/126
See application file for complete search history.

(56) References Cited

U.S. PATENT DOCUMENTS

| | | | | |
|---|---|---|---|---|
| 5,444,386 | A * | 8/1995 | Mizumura | 324/754 |
| 6,085,407 | A * | 7/2000 | Gamel et al. | 29/712 |
| 6,218,849 | B1 * | 4/2001 | Kiyokawa | 324/755 |
| 6,461,938 | B1 * | 10/2002 | Nakabayashi | 438/458 |
| 6,558,975 | B1 * | 5/2003 | Sugino et al. | 438/64 |
| 6,800,840 | B1 * | 10/2004 | Nakano et al. | 250/221 |
| 6,906,542 | B1 * | 6/2005 | Sakagawa et al. | 324/754 |
| 6,919,262 | B1 * | 7/2005 | Senoo et al. | 438/464 |
| 6,998,629 | B1 * | 2/2006 | Fan | 250/559.29 |
| 2002/0026931 | A1 | 3/2002 | Kurosawa et al. | |
| 2004/0038498 | A1 * | 2/2004 | Ozono et al. | 438/464 |
| 2005/0003635 | A1 * | 1/2005 | Takekoshi | 438/464 |
| 2005/0003636 | A1 * | 1/2005 | Takyu et al. | 438/464 |
| 2005/0070074 | A1 * | 3/2005 | Priewasser | 438/462 |
| 2005/0156321 | A1 * | 7/2005 | Misumi et al. | 257/777 |
| 2006/0005911 | A1 * | 1/2006 | Kubo et al. | 156/84 |

* cited by examiner

*Primary Examiner*—Stephone B. Allen
*Assistant Examiner*—Davienne Monbleau
(74) *Attorney, Agent, or Firm*—Christie, Parker & Hale, LLP

(57) ABSTRACT

A frame transfer prober 1, for carrying out an electrical property test on a number of semiconductor chips 10 fixed on a dicing tape 11, comprises a separation detection unit 9 for detecting the separation and/or protrusion of the semiconductor chips 10 from the dicing tape. The separation detection unit has a light emitting portion 91 for emitting a laser beam L, a light receiving portion 92 for receiving the laser beam L so emitted and a determination portion 93 for determining the separation and/or protrusion of the semiconductor chips through an increase or decrease in amount of the laser beam L so received.

5 Claims, 3 Drawing Sheets

FRAME TRANSFER PROBER

BACKGROUND OF THE INVENTION

1. Field of the Invention

The present invention relates to a frame transfer prober for performing electrical property tests on a number of semiconductor chips fixed to a dicing tape and, more particularly, to a frame transfer prober which can detect the separation of a semiconductor chip from the dicing tape.

2. Description of the Related Art

A number of semiconductor devices having the same electric device circuit formed thereon are formed on a surface of a wafer and, in order to test the electrical properties of each electric device circuit before the electric device circuits are cut into individual semiconductor devices (semiconductor chips), the electric device circuits are tested by a prober to see whether they are good or not good. In general, the prober has a probing needle which corresponds to each semiconductor device on the wafer and is constructed such that a probe card connected to a tester is made to correspond to each semiconductor device on the wafer sequentially so that the probing needle is brought into contact with an electrode pad of the semiconductor device to thereby implement an electrical measurement.

In recent years, in order to realize a miniaturization in size, weight and thickness of electronic apparatuses such as mobile phones, digital cameras and portable information terminals, the installation techniques for semiconductor integrated circuits have entered the stage of chip size package (CSP) or wafer level chip size package (WCSP). In a CSP, semiconductor chips are stacked for use.

Due to this, wafers have been in demand which are thinned to 100 μm or smaller and, in wafers which are so thinned, the occurrence of failure becomes highly probable while the wafer is cut into individual semiconductor chips in a dicing process that is carried out after the electrical property test has been performed on the semiconductor chips by the prober. In addition, it has been desired to reduce the defective fraction of actually installed semiconductor chips by performing the electrical property test at as late a stage as possible where processed semiconductor devices are close to being final semiconductor chip products.

It is conventional practice to perform the electrical property test on semiconductor chips using a frame transfer prober. In this case, in order to prevent individual semiconductor chips which are cut in the dicing process from scattering, the wafer is diced after a dicing tape has been applied to a surface of the wafer where the number of semiconductor devices are not formed. The dicing tape is formed into a circular shape which is similar to the shape of the wafer, and the dicing tape is extended to increase the diameter thereof after the wafer has been diced and is then held in the extended state by a ring-shaped metallic frame. Namely, individual semiconductor chips so produced are held while being affixed to the dicing tape in a state where intervals (cuts) between the individual semiconductor chips are slightly expanded. The semiconductor chips are transferred in that state on a frame, and the electric property test is performed on each semiconductor chip while the semiconductor chips are held on a stage of a frame transfer prober.

In the conventional method, however, there sometimes occurs a case where a semiconductor chip is separated from the dicing tape. In the event that the electric property test is performed in this state, there has been caused a problem that the semiconductor chip that is separated is brought into contact with a probe card needle of the frame transfer prober, whereby the probing needle and the chip are damaged, or the separated semiconductor chip collides against an alignment camera when aligning the chip for positioning, whereby the alignment camera and the chip are damaged.

SUMMARY OF THE INVENTION

The present invention was made with a view to solving the problem, and an object thereof is to provide a frame transfer prober which can detect in advance the separation and/or protrusion of a semiconductor chip from a dicing tape to thereby prevent the failure of a probe card needle and protect an alignment camera.

According to a first aspect of the invention, there is provided a frame transfer prober comprising a separation detection unit for detecting the separation and/or protrusion in a height direction of a semiconductor chip from a dicing tape and, by this construction, a semiconductor chip which is separating and protruding can be removed in advance, thereby making it possible to prevent the breakage of a probe card needle, an alignment camera and a semiconductor chip which would otherwise be caused when the separating and protruding semiconductor chip is brought into contact with them.

According to a second aspect of the invention, there is provided a frame transfer prober as set forth in the first aspect of the invention, wherein the separation detecting unit has a light emitting portion, a light receiving portion and a determination portion, whereby a laser beam from the light emitting portion is received by the light receiving portion so that the separation and/or protrusion of a semiconductor chip can be determined based on an increase or decrease in amount of the laser beam so received.

According to a third aspect of the invention, there is provided a frame transfer prober as set forth in the first aspect of the invention, wherein the separation detection unit has a transmitting portion, a receiving portion and a determination portion, whereby a supersonic wave from the transmitting portion is received by the receiving portion so that the separation and/or protrusion of a semiconductor chip may be determined based on an increase or decrease in amount of the supersonic wave so received. Also in this case, a similar advantage to that provided when the laser beam is used can be provided.

The present invention may be more fully understood from the description of preferred embodiments of the invention, as set forth below, together with the accompanying drawings.

DESCRIPTION OF THE PREFERRED EMBODIMENTS

Figure 1:
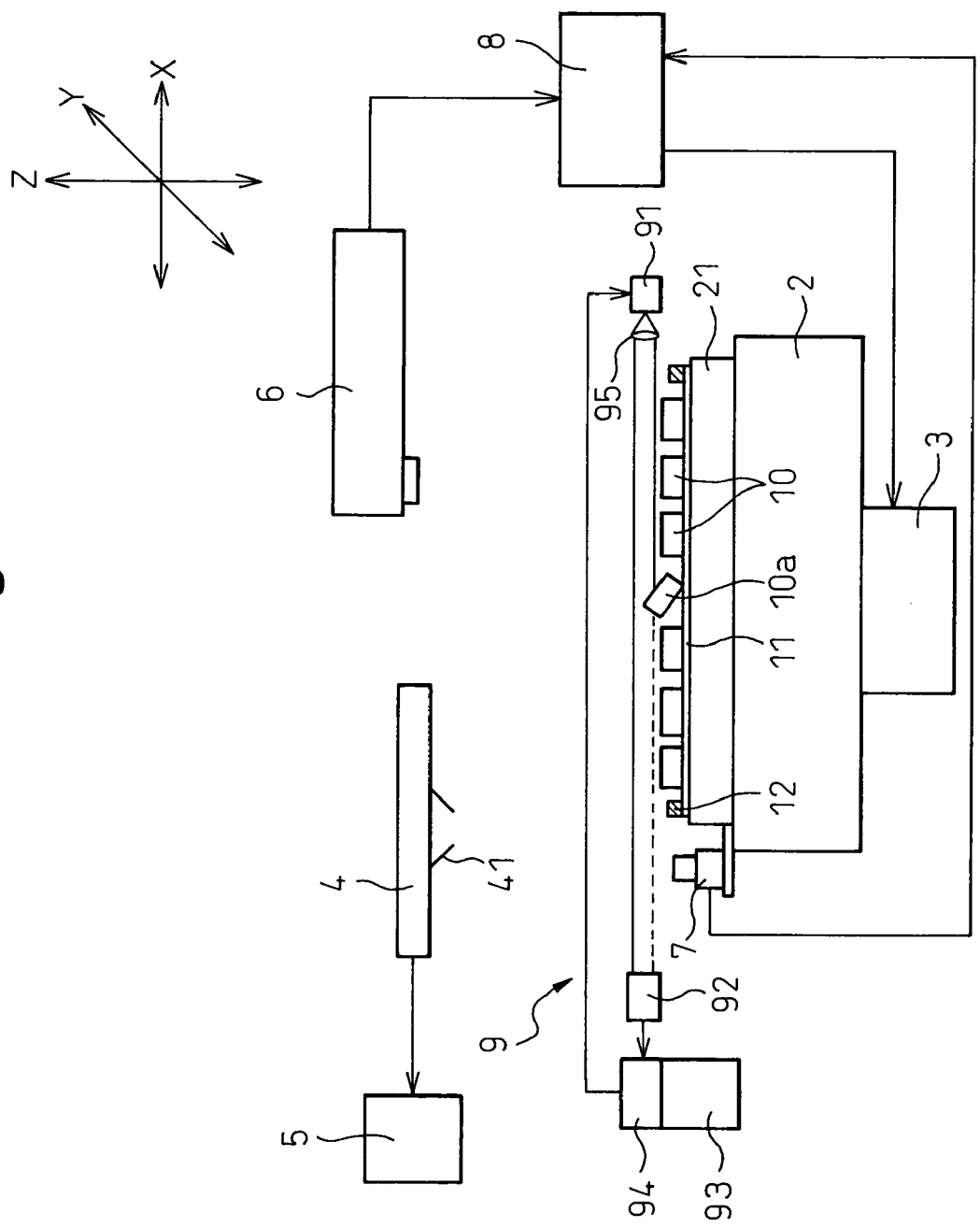
FIG. 1 is a schematic drawing showing the overall configuration of a frame transfer prober according to an embodiment of the invention.
Figure 2:
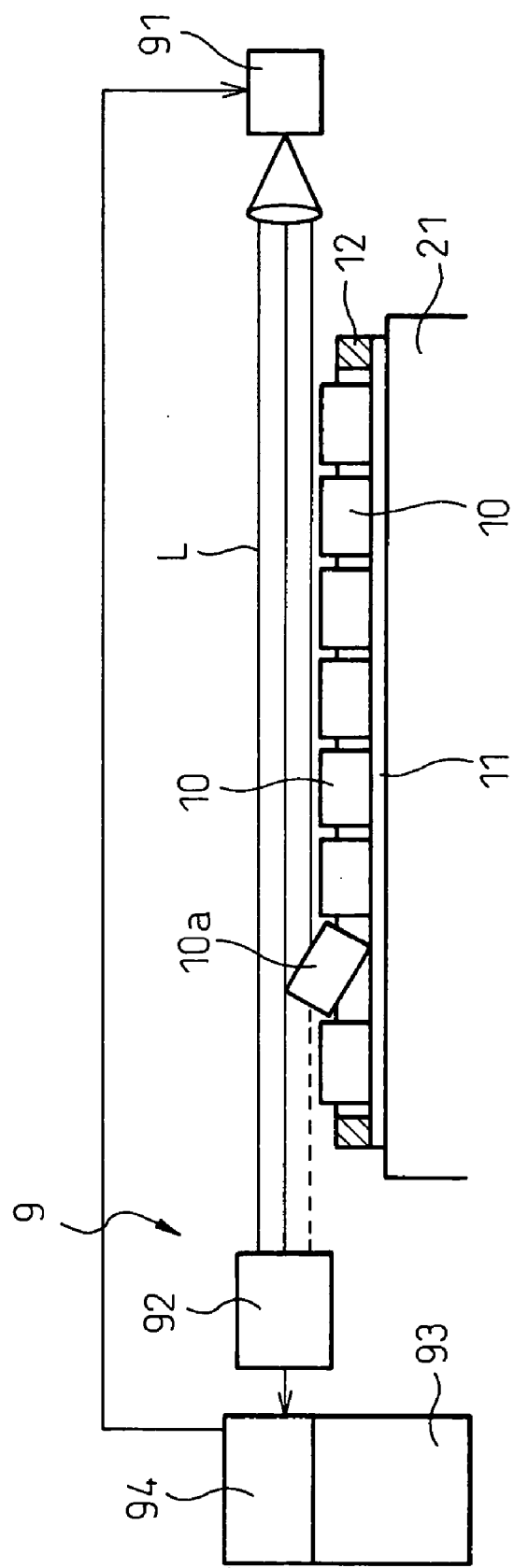
FIG. 2 is an explanatory drawing which explains a separation detecting unit of the frame transfer prober of the invention.

A frame transfer prober according to an embodiment of the invention will be described below based on the drawings. A normal prober and a frame transfer prober are different from each other only in that, as has been described before, the normal prober is intended to carry out an electric property test on semiconductor devices formed on a wafer, whereas the frame transfer prober is intended to carry out an electric property test on semiconductor chips which are diced individually from a wafer, and the mechanisms of those probers are similar to each other. FIG. 1 is a schematic drawing showing the overall configuration of the frame transfer prober according to the invention. FIG. 2 is a drawing which explains a separation detection unit which constitutes a feature of the invention.

As in a normal prober, a frame transfer prober 1 includes a stage 2, a stage driving motor 3, a probe card 4 on which probing needles 41 are provided, a tester 5, an alignment optical device 6, a stage side CCD camera 7 and a control unit 8 and has a separation detection unit 9.

Individual semiconductor chips 10 which are diced from a wafer are held by a ring-shaped frame 12 while the chips are securely affixed to a dicing film 11 and are transferred in this state. As has been described before, the semiconductor chips 10 in that state are formed by affixing the dicing tape 11 on a back surface of the wafer on which no electric device circuit is formed and then dicing the wafer. During this dicing, the semiconductor chips 10 are affixed to the dicing tape 11 while they are cut individually. Next, the dicing tape 11 is extended equally in radial directions and is held by the ring-shaped frame 12 while it is being so extended. Thus, the semiconductor chips 10 are transferred on the frame 12 in this state.

The semiconductor chips 10 are held on a chuck portion 21 on the stage 2 while being kept on the frame 12. The stage 2 is constructed so as to be moved in X, Y and Z directions, as well as in a rotational direction θ by the stage driving motor 3 which is controlled by the control unit 8, whereby the semiconductor chips 10 which are held on the chuck portion 21 on the stage 2 can be moved in a three-dimensional fashion.

A number of electrode pads (not shown) are formed on a surface of the semiconductor chips 10, and the probing needles 41 are provided on the probe card 4 in such a manner as to correspond to the electrode pads of the semiconductor chips 10. Consequently, the electrical properties of the semiconductor chips 10 can be tested by bringing the probing needles 41 on the probe card 4, which is connected to the tester 5, into contact with the electrode pads of the semiconductor chips 10. Note that, in the event that the semiconductor chips 10 are to be tested at one time, a corresponding number of probing needles to the number of electrode pads are provided on the probe card 4.

Also note that, in the frame transfer prober 1 according to the invention, as with the normal prober, an alignment optical device 6 in the form of an alignment camera is provided. Namely, the CCD camera 7 for photographing the probing needle 41 from therebelow to detect the position of a distal end of the probing needle is attached to the stage 2, and the position of the distal end of the probing needles 41 are detected by moving the CCD camera 7, by moving the stage 2, while adjusting the focus of the camera, and the results of the detection are inputted into the control unit 8. In addition, the alignment optical device 6 recognizes the pattern of the semiconductor chips 10 and inputs the pattern so recognized into the control unit 8. Thus, the alignment of the distal end of the probing needle 41 with the electrode pad on the semiconductor chip 10 can be carried out automatically in the control unit 8 based on information obtained by the alignment optical device 6 and information on the position of the distal end of the probing needle, obtained by the CCD camera 7 on the stage, using a known image-processing technique.

Furthermore, a separation detection unit 9, which is a feature of the invention, is provided on the frame transfer prober 1 according to the invention for detecting the separation and/or protrusion of the semiconductor chips 10 from the dicing tape 11. The separation detection unit 9 is made up of a light emitting portion 91 for emitting a laser beam L, a light receiving portion 92 for receiving the laser beam L from the light emitting portion, a determination portion 93 for detecting the separation or protrusion of the semiconductor chips 10 based on an increase or decrease in amount of the laser beam L received by the light receiving portion 92 and an amplifier 94. The laser beam L emitted from the light emitting portion is converted into a parallel beam by a lens 95 and advances toward the light receiving portion 92 above the semiconductor chips 10. When part of the semiconductor chip 10 is separated from the dicing tape 11 to be floated or held up, part of the laser beam L is shielded by the semiconductor chip 10, part of which is held up, and, hence, does not reach the light receiving portion 92. Thus, the laser beam L is emitted above the semiconductor chips 10 and is then caused to approach gradually an upper surface of the semiconductor chips 10 by moving the stage 2 in, for example, a Z axis direction, so that the separation or protrusion of the semiconductor chips 10 from the dicing tape 11 within a row parallel to a Y axis can be detected by an increase or decrease in amount of light received by the light receiving portion 92.

Figure 3:
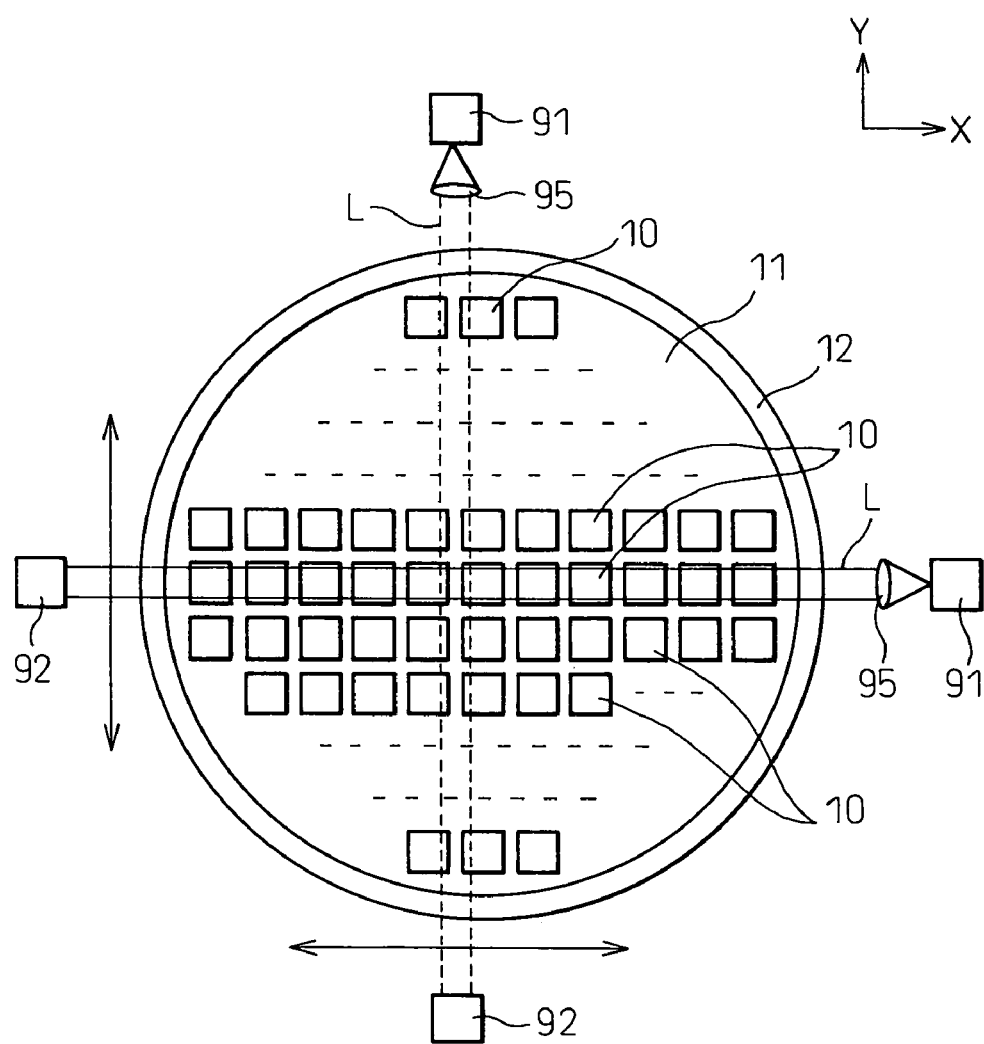
FIG. 3 is a plan view showing the arrangement of the separation detection unit of the frame transfer prober of the invention.

In this case, as shown in FIG. 3, the existence of separation or protrusion, of the semiconductor chips 10 which reside in rows parallel to the Y axis can be detected by scanning the stage 2 in a Y axis direction. In the event that the existence of separation or protrusion of the individual semiconductor chips 10 on X and Y coordinate axes is to be detected accurately, as shown in FIG. 3, another pair of light emitting portion and light receiving portion is provided which is disposed in such a manner that the phase thereof is shifted through 90 degrees from the existing pair, so that the separation or protrusion of the semiconductor chips 10 within in rows parallel to the X axis can be detected by scanning the stage 2 in an X axis direction.

Note that the positions of the semiconductor chips 10 can be identified in the X and Y coordinate axes with the single pair of light emitting portion and light receiving portion by rotating the stage 2 through 90 degrees.

In addition, in this embodiment, the stage 2 side is moved for scanning while the light emitting portion 91/light receiving portion 92 side is fixed, but the light emitting portion 91/light receiving portion 92 side may be moved for scanning while the stage 2 side is fixed.

Thus, the semiconductor chips 10 which are determined to be out of position by the determination portion 93 are removed manually or automatically or the electric property test is carried out while avoiding the semiconductor chips 10 determined to be out of position. Thus, the contact of the separating or protruding semiconductor chips with the probe card needle or the alignment camera can be avoided, thereby making it possible to prevent breakage thereof.

Note that while, in the above embodiment, the separation or protrusion of the semiconductor chips 10 from the dicing tape is designed to be detected by use of the laser beam L but a supersonic wave may be used in place of the laser beam L. In this case, it is natural that a transmitting portion for transmitting a supersonic wave and a receiving portion for receiving the supersonic wave so transmitted are used in place of the laser beam emitting portion 91 and the laser beam receiving portion, respectively.

While the invention has been described by reference to the specific embodiments chosen for the purpose of illustration, it should be apparent that numerous modifications could be made thereto by those skilled in the art without departing from the basic concept and scope of the invention.

The invention claimed is:

1. A frame transfer prober for carrying out an electrical property test on a number of diced semiconductor chips fixed to a dicing tape comprising:
    a separation detection unit for detecting one or more of a separation and protrusion of one or more of the semiconductor chips from the dicing tape in a height direction;
    a stage for holding the dicing tape; and
    a stage driving motor for moving the stage in an X axis direction, a Y axis direction, a Z axis direction, and a rotational direction round the Z axis for aligning the stage with the separation detection unit for detecting positions of the semiconductor chips in the X axis direction and the Y axis direction.

2. A frame transfer prober as set forth in claim 1, wherein the separation detecting unit includes a light emitting portion, a light receiving portion and a determination portion for determining the separation or protrusion of the semiconductor chip through an increase or decrease in amount of light received at the light receiving portion.

3. A frame transfer prober as set forth in claim 1, wherein the separation detection unit includes a transmitting portion for transmitting a supersonic wave, a receiving portion for receiving a supersonic wave from the transmitting portion and a determination portion for determining the separation or protrusion of the semiconductor chip through an increase or decrease in amount of the supersonic wave received at the receiving portion.

4. A frame transfer prober as set forth in claim 1, wherein the separation detection unit is disposed on a side of the stage.

5. A frame transfer prober as set forth in claim 1, further comprising a ring-shaped frame disposed on a top of the stage.

* * * * *